(12) United States Patent
Downes

(10) Patent No.: US 6,773,269 B1
(45) Date of Patent: Aug. 10, 2004

(54) CIRCUIT BOARD ASSEMBLY WHICH UTILIZES A PIN ASSEMBLY AND TECHNIQUES FOR MAKING THE SAME

(75) Inventor: Stuart D. Downes, Milford, MA (US)

(73) Assignee: EMC Corporation, Hopkinton, MA (US)

( * ) Notice: Subject to any disclaimer, the term of this patent is extended or adjusted under 35 U.S.C. 154(b) by 0 days.

(21) Appl. No.: 10/259,053

(22) Filed: Sep. 27, 2002

(51) Int. Cl.$^7$ ............................................... H01R 12/00
(52) U.S. Cl. ............................ 439/75; 439/65; 439/55
(58) Field of Search ............................. 439/75, 65, 55

(56) References Cited

U.S. PATENT DOCUMENTS

| | | | |
|---|---|---|---|
| 4,076,356 A | | 2/1978 | Tamburro ..................... 339/17 |
| 4,627,678 A | * | 12/1986 | Biswas ......................... 439/75 |
| 4,859,188 A | * | 8/1989 | Neumann ..................... 439/45 |
| 4,968,263 A | | 11/1990 | Silbernagel et al. ........ 439/246 |
| 5,017,145 A | * | 5/1991 | Kanai et al. ................... 439/45 |
| 5,169,322 A | * | 12/1992 | Frantz et al. ................. 439/82 |
| 5,340,319 A | * | 8/1994 | Enomoto et al. ............. 439/75 |
| 5,548,486 A | * | 8/1996 | Kman et al. ................ 361/791 |
| 5,565,654 A | | 10/1996 | Zell et al. ................... 174/265 |
| 5,816,868 A | | 10/1998 | Legrady et al. ............. 439/876 |
| 6,049,039 A | | 4/2000 | Fushimi ..................... 174/68.1 |
| 6,179,631 B1 | | 1/2001 | Downes et al. ............... 439/83 |
| 6,217,346 B1 | | 4/2001 | Cubon .......................... 439/78 |
| 6,229,101 B1 | | 5/2001 | Sekiya et al. .............. 174/266 |
| 6,464,542 B1 | * | 10/2002 | Lee ............................. 439/680 |
| 6,623,280 B2 | * | 9/2003 | Oldenburg et al. ........... 439/75 |

FOREIGN PATENT DOCUMENTS

| | | |
|---|---|---|
| JP | 363285961 A | 11/1988 |
| JP | 410074884 A | 3/1998 |

\* cited by examiner

Primary Examiner—Dean A. Reichard
Assistant Examiner—Jinhee Lee
(74) Attorney, Agent, or Firm—David E. Huang, Esq.

(57) ABSTRACT

A pin assembly is configured to interconnect a first circuit board and a second circuit board. The pin assembly includes a set of pins. Each pin of the set of pins has a first end, a second end, and a mid-portion. The pin assembly further includes a frame which contacts the mid-portion of each pin of the set of pins to position the pins such that (i) the first ends of the pins simultaneously register into respective holes of the first circuit board when the pin assembly engages with the first circuit board, and (ii) the second ends of the pins simultaneously register into respective holes of the second circuit board when the pin assembly engages with the second circuit board.

31 Claims, 9 Drawing Sheets

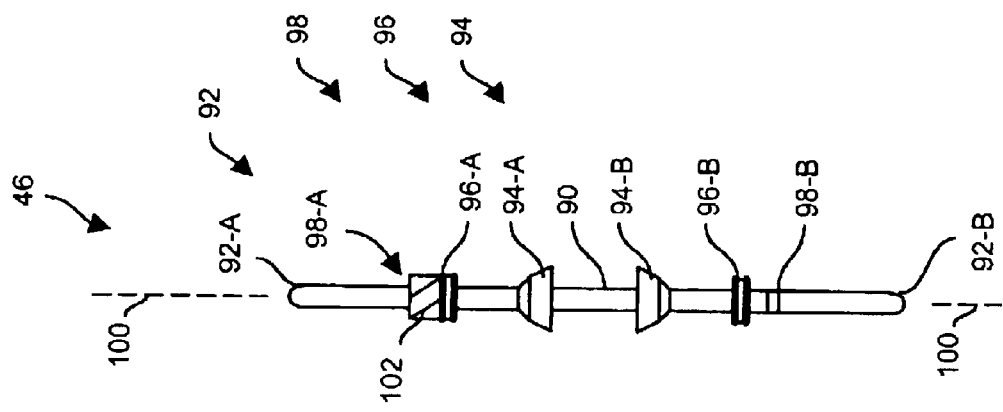
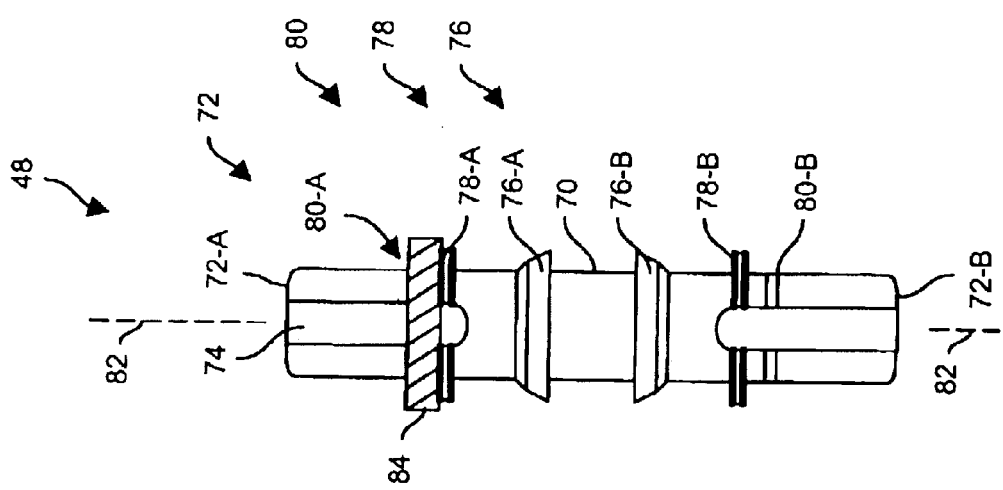

CIRCUIT BOARD ASSEMBLY WHICH UTILIZES A PIN ASSEMBLY AND TECHNIQUES FOR MAKING THE SAME

BACKGROUND OF THE INVENTION

Circuit boards are capable of connecting with other circuit boards through connecting devices such as circuit board connectors, cables, backplanes, and the like. One conventional circuit board assembly includes a relatively large primary circuit board, and a smaller circuit board. The larger primary circuit board includes circuitry (e.g., a combination of integrated circuit devices, resistors, capacitors, etc.) that performs primary operations of the circuit board assembly, i.e., data storage operations. The smaller circuit board performs a specialized function, i.e., power conversion to supply the circuitry of the primary circuit board with a converted power signal.

To form this conventional circuit board assembly, the manufacturer lays the large primary circuit board horizontally and then inserts the ends of four power pins, one at a time, into large plated-through holes of the primary circuit board. The power pins are relatively thick, and have flanges which hold solder pre-forms in place near the ends of the power pins. After the manufacturer individually inserts the power pins into the primary circuit board, the manufacturer then holds the smaller circuit board in a horizontal position over the primary circuit board, and inserts the opposite ends of the power pins, one at a time, into large plated-through holes of the smaller circuit board to form an unsoldered circuit board assembly. The manufacturer then sends the unsoldered circuit board assembly through a soldering process. During this process, the solder pre-forms melt and flow around grooves at the ends of the power pins and into the plated-through holes to form solder joints. The grooves facilitate gas percolation out of the holes and enable the circuit boards and pins to fall accurately in place due to drawing action of the melted solder from the solder pre-forms. Circuit board components which were previously mounted on the circuit boards (e.g., to the circuit board undersides) do not significantly re-flow during the soldering process because they were previously mounted using high temperature solder, i.e., their solder joints have a higher melting temperature than that used during the soldering process.

The end result of the assembly process is a circuit board assembly having a large circuit board and a small circuit board which are parallel to each other. The power pins extend perpendicularly from the planes of the two circuit boards to provide electrical paths for carrying power signals therebetween, as well as to provide structural separation between the two circuit boards.

SUMMARY OF THE INVENTION

Unfortunately, there are deficiencies to the above-described conventional circuit board assembly which includes a large circuit board, a small circuit board and a four power pins soldered therebetween. For example, it takes time to meticulously align the power pins one at a time between the two circuit boards prior to soldering. Although the manufacturer could make the circuit board holes larger, and thus make it easier to fit the pin ends into the holes, the manufacturer may simultaneously create other drawbacks by doing so such as displacing neighboring traces and/or degrading signal integrity. If one of the power pins is misaligned, that pin will solder improperly between the two circuit boards, and thus not properly carry a power signal between the two circuit boards when the circuit board assembly is powered up. Accordingly, improper power pin alignment will cause the circuit board assembly to operate incorrectly or not operate at all.

Additionally, although it is possible to rework circuit board assemblies having improperly aligned and soldered power pins (e.g., the manufacturer can unsolder the two circuit boards and the power pins, clean the circuit boards, and re-solder the circuit boards together using new power pins), such reworking is an expensive and time consuming task. Moreover, there is always a risk that one or both of the circuit boards will be damaged beyond repair during the rework process forcing the manufacturer to scrap work product that was otherwise good in all other respects.

Furthermore, the earlier-described assembly steps for creating the conventional circuit board assembly is suitable when interconnecting two circuit boards using only four power pins but not well-suited for interconnecting two circuit boards with significantly more pins. For example, suppose that the manufacturer wants additional electrical pathways (e.g., more than 10 additional pathways) between to two circuit boards in order to carry control and status signals. Unfortunately, it is difficult for the manufacturer to interconnect the two circuit boards with other pins in addition to the four thick power pins (e.g., thinner signal pins for carrying data signals). In particular, as the number of pins increases, it becomes exceedingly more difficult for the manufacturer to properly position each pin one at a time into the primary circuit board and then to maintain proper pin registration as additional pins are added. Additionally, it becomes exceedingly more difficult for the manufacturer to subsequently place the smaller circuit board into engagement with all of the pins, as the number of pins increases. That is, for each additional pin, the installation time and the possibility of mis-registration of a pin increases. The increased installation time and the time required to rework improperly manufactured circuit board assemblies may thus significantly increase manufacturing expense.

Moreover, thinner signal pins typically solder to circuit boards using a wave soldering process, i.e., a soldering process which involves wicking up solder into a hole having a diameter that in some situations is roughly twice the signal pin diameter. The use of such holes and their associated large anti-pads (e.g., another 30 percent larger than the hole) can impose significant limitations to neighboring trace locations and can also create signal integrity problems. Of course, narrowing the holes makes it more difficult to wick up solder and to form reliable solder joints as well as makes it more difficult for the manufacturer to install the pins and the second circuit board. Accordingly, a manufacturer may be reluctant to add signal pins between two parallel circuit boards for enhanced connectivity (e.g., for carrying control signals therebetween).

One alternative to adding more pins between to the two circuit boards is for the manufacturer to add a circuit board connector to each circuit board. Unfortunately, the use of circuit board connectors requires additional circuit board real estate (i.e., surface area on the circuit boards in order to mount the connectors) which, in many instances, is very expensive. Moreover, the use of such connectors would provide competing stresses to the circuit boards during the soldering process which could result in damaged solder joints (e.g., mis-registration of the power pins prior to soldering, solder joint fractures after soldering, etc.).

In contrast to the above-described conventional circuit board assembly which is formed by a manufacturer (i)

inserting ends of power pins into a first circuit board one at a time, (ii) inserting opposite ends of the power pins into a second circuit board, and (iii) soldering the power pins to the first and second circuit boards, the invention is directed to techniques for making circuit board assemblies which utilize a pin assembly having a set of pins and a frame which holds the set of pins in place. The pin assembly enables a manufacturer to simultaneously register ends of all of the pins into a first circuit board and then simultaneously register opposite ends of the all of the pins into a second circuit board. The frame holds the pins in place to ensure proper and consistent pin registration in each circuit board.

One embodiment of the invention is directed to a pin assembly for interconnecting a first circuit board and a second circuit board. The pin assembly includes a set of pins. Each pin of the set of pins has a first end, a second end, and a mid-portion. The pin assembly further includes a frame which contacts the mid-portion of each pin of the set of pins to position the pins such that (i) the first ends of the pins simultaneously register into respective holes of the first circuit board when the pin assembly engages with the first circuit board, and (ii) the second ends of the pins simultaneously register into respective holes of the second circuit board when the pin assembly engages with the second circuit board. The use of the pin assembly enables a circuit board assembly manufacturer to save time registering the pins while making circuit board assemblies. Additionally, use of the pin assembly enables the manufacturer to use an intrusive reflow process when soldering the pins (e.g., signal pins, power pins, or both) to the circuit boards due to the reliable pin positioning provided by the pin assembly thus enabling the circuit boards to have smaller anti-pads and thus freeing up circuit board real estate to alleviate trace congestion particularly around the circuit board holes. Furthermore, use of the pin assembly reduces or eliminates the possibility of having to rework the circuit board assembly due to improperly registered pins.

In one arrangement, each pin of the set of pins includes (i) outer flanges which are configured to seat that pin relative to the first and second circuit boards, and (ii) inner flanges which define the mid-portion of that pin and which are configured to hold the pin rigidly in place relative to the frame. Accordingly, such pin features facilitate positioning of the pins relative the frame, as well as facilitate positioning of the pins (and the pin assembly as a whole) relative to the circuit boards thus providing uniform pin insertion height.

In one arrangement, the frame includes a set of stress relief portions which is configured to flex in response to uneven stresses placed on the pin assembly. In one arrangement, the set of stress relief portions includes frame segments which define V-shaped notches. The stress relief portions reduce the likelihood of irregular bowing or buckling of the pin assembly due to uneven stresses during soldering. Accordingly, the pins remain well-positioned when heat is applied to solder the pin assembly to the circuit boards, i.e., the pins will not bind due to movement resulting from (i) different coefficients of expansion among circuit board materials during soldering, or (ii) the circuit boards warping toward or away from each other during soldering.

In one arrangement, the set of pins includes a set of power pins, and a set of signal pins. Each power pin of the set of power pins has a power pin diameter, and wherein each signal pin of the set of signal pins has a signal pin diameter that is narrower than the power pin diameter. Accordingly, the pin assembly is capable of carrying both power signals as well as data signals between the circuit boards thus alleviating the need for additional circuit board components such as additional circuit board connectors which require a significant additional amount of circuit board real estate.

In one arrangement, the frame defines a rectangular, skeletal shape. That is, the frame substantially extends around a periphery of the defined rectangular, skeletal shape while substantially avoiding an inner region of the defined rectangular, skeletal shape. Accordingly, the frame does not interfere (e.g., contact) with circuit board components which are mounted to the circuit boards and which extend outwardly near the frame.

The features of the invention, as described above, may be employed in systems, devices and procedures such as those of EMC Corporation of Hopkinton, Mass.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

FIG. 3 is a side view of a power of the pin assembly of FIG. 2.

FIG. 4 is a side view of a signal pin of the pin assembly of FIG. 2.

DETAILED DESCRIPTION

The invention is directed to techniques for making circuit board assemblies which utilize a pin assembly having a set of pins and a frame which holds the set of pins in place. The pin assembly enables a manufacturer to simultaneously register (i.e., insert and position) ends of the pins into a first circuit board and then simultaneously register opposite ends of the pins into a second circuit board. During assembly and during soldering, the frame holds the pins in place to ensure proper and consistent pin registration in each circuit board.

Figure 1:
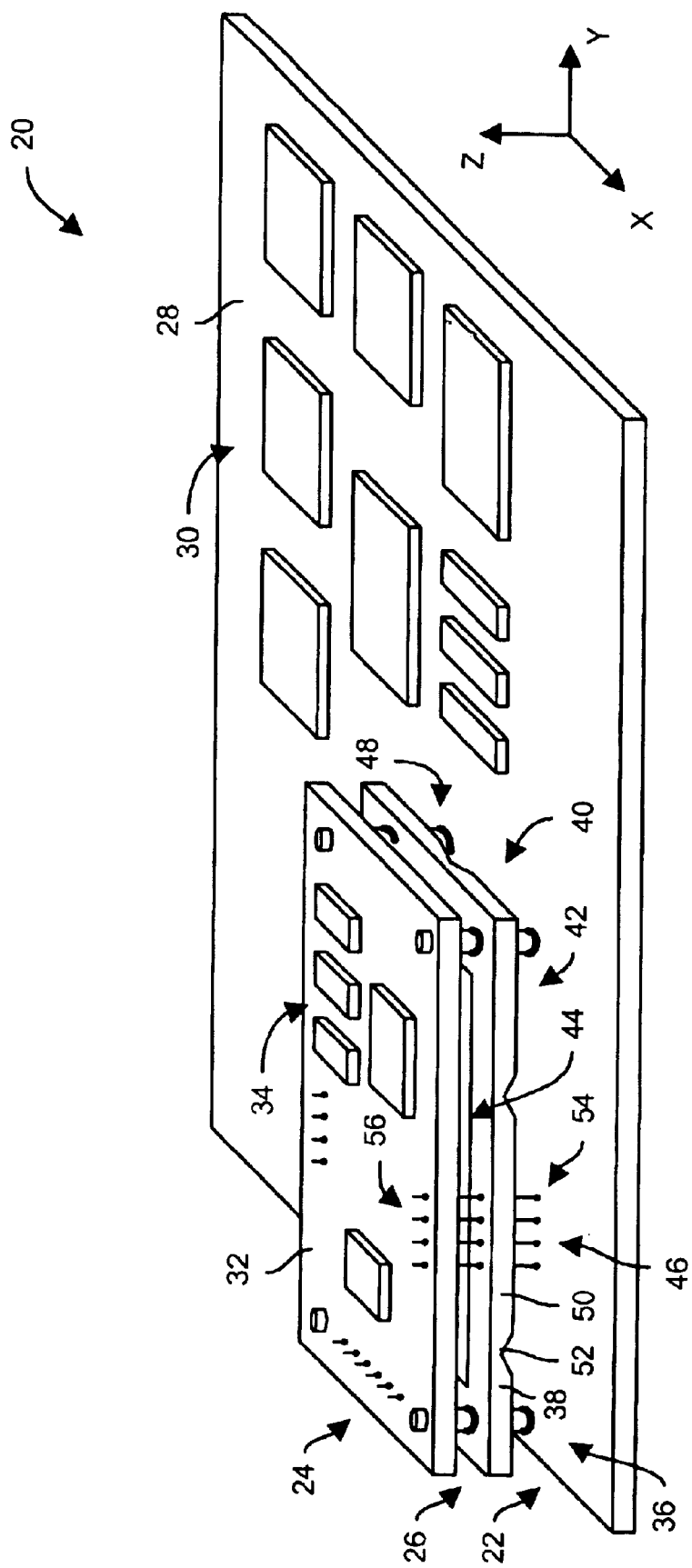
FIG. 1 is a general perspective view of a circuit board assembly which is suitable for use by the invention.

FIG. 1 is a general view of a circuit board assembly 20 which is suitable for use by the invention. The circuit board assembly 20 includes a first circuit board 22, a second circuit board 24 and a pin assembly 26. By way of example only, the first circuit board 22 is substantially larger than the second circuit board 24. In one arrangement, the circuit board 24 has a width within the range of 1.80 to 2.00 inches, and a length within the range of 2.30 to 2.70 inches.

The first circuit board 22 includes a section of circuit board material 28 (e.g., layers of conductive and non-conductive material sandwiched together), and a set of circuit board components 30 (e.g., integrated circuits, resistors, capacitors, connectors, etc.) which mount to the circuit board section 28. Similarly, the second circuit board 24 includes a section of circuit board material 32, and a set of circuit board components 34 which mount to the circuit board section 32.

The pin assembly 26 includes a set of pins 36 and a frame 38. The frame 38, by way of example only, mirrors the shape of the second circuit board 24. In particular, the frame 38 has a rectangular, skeletal shape 40. The frame 38 extends along a periphery 42 of the rectangular, skeletal shape 40 and contacts the pins 36 which are disposed around a periphery of the second circuit board 24. An inner region 44 of the rectangular, skeletal shape 40 (i.e., the inner area of the frame 38) is hollow thus enabling the frame 28 to avoid contact with the circuit board components 30, 34 of the circuit boards 22, 24 (note that the second circuit board 24 may include circuit board components on its underside) and to enable heat to escape when the circuit board assembly 20 is in operation.

As shown in FIG. 1, the pins 36 include a set of signal pins 46 and a set of power pins 48. The diameters of the signal pins 46 are narrower than the diameters of the power pins 48. As further shown, the frame 38 includes thick segments 50 which are suitable for holding the pins 36, and thinner, stress-relief segments 52. As will be explained in further detail later, the stress-relief segments 52 enable the frame 38 to maintain proper registration of the pins 36 as the pins 36 solder into holes 54 (e.g., vias) of the first circuit board 22 and holes 56 of the second circuit board 24 even if uneven stresses are placed on the frame 38. That is, the stress-relief segments 52 comply when uneven stress are placed on the frame 38 (e.g., due to different coefficients of expansion of various components of the circuit board assembly 20 during soldering, due to warping of the circuit boards toward or away from each other during soldering, etc.) thus preventing the frame 38 from substantially bending or bowing.

As further shown in FIG. 1, each of the circuit boards 22, 24 defines a plane that extends substantially in parallel with the X-Y plane. Furthermore, each of the pins 36 extends along an axis that is substantially perpendicular to the X-Y plane (i.e., the Z-axis). Further details of the invention will now be provided with reference to FIG. 2.

Figure 2:
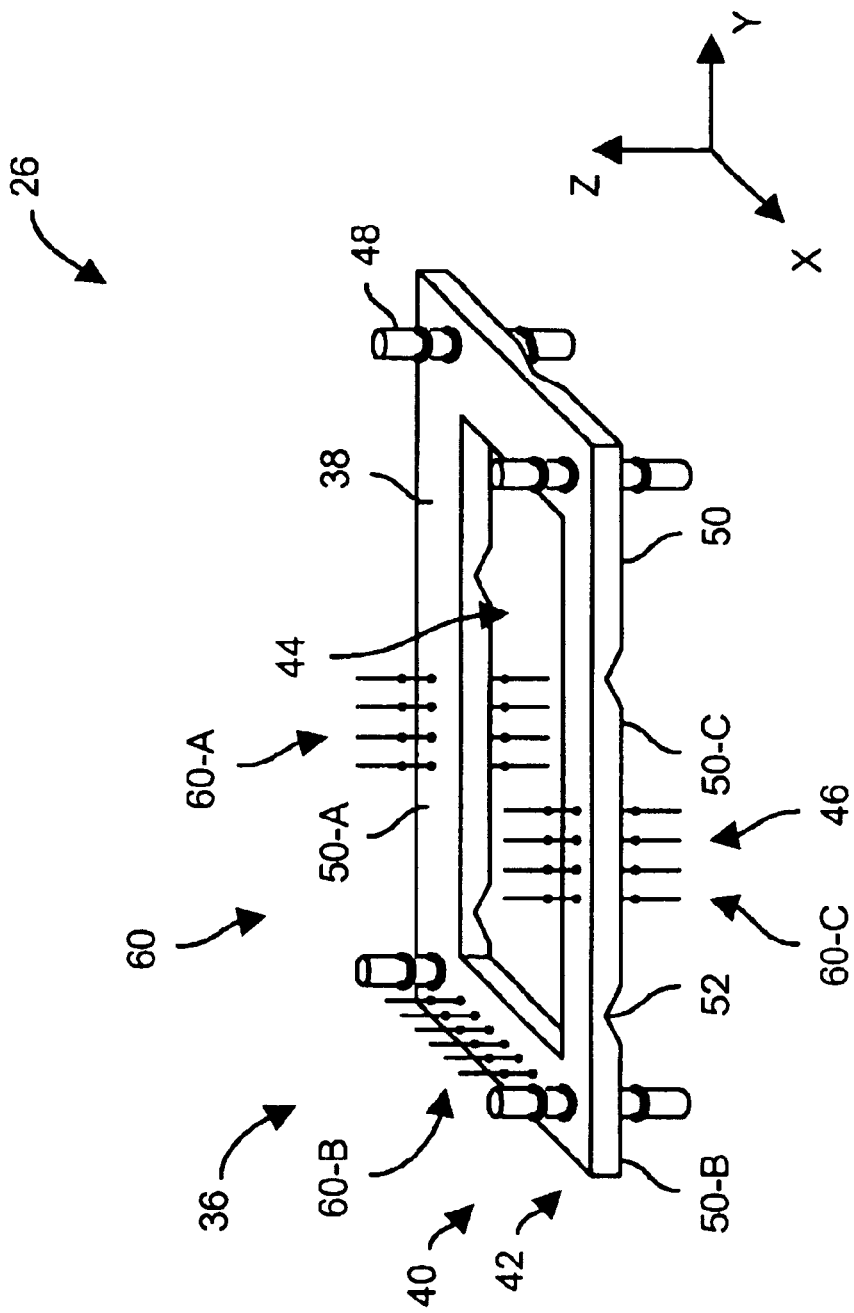
FIG. 2 is a general perspective view of a pin assembly of the circuit board assembly of FIG. 1.

FIG. 2 is a general view of the pin assembly 26 of the circuit board assembly 20. As shown, the frame 38 of the pin assembly 26 has a substantially rectangular shape 40. In particular, the frame 38 extends around the periphery 42 of the rectangular shape 40, but is empty in the middle 44 in order to avoid contact with the circuit board components 30, 34 of the circuit boards 22, 24 and to allow heat to escape. As further shown, each of the pins 36 (i) extends substantially in the Z-direction and (ii) is thus substantially perpendicular to the X-Y plane defined by the frame 38.

As also shown in FIG. 2, the thick segments 50 of the frame 38 have a rectangular cross-section and support clusters 60 of pins 36. By way of example, a first thick segment 50-A of the frame 38 holds a first cluster 60-A (e.g., a row) of signal pins 46, a second thick segment 50-B holds a second cluster 60-B of signal pins 46 and two power pins 48, and so on. The stress-relief segments 52 separate the thick segments 50, as well as separate the pin clusters 60. By way of example only, the stress-relief segments 52 are formed by placing V-shaped notches in particular locations of the frame 38. Further details of the invention will now be provided with reference to FIG. 3.

FIG. 3 is a side view of a power pin 48 of the pin assembly 26. Each power pin 48 includes a mid-portion 70, and end portions 72-A, 72-B (collectively, end portions or simply ends 72) which define grooves 74 that extend toward the mid-portion 70 (e.g., three grooves 74 evenly spaced around each end 72). Each power pin 48 further includes inner flanges 76-A, 76-B (collectively, inner flanges 76), outer flanges 78-A, 78-B (collectively, outer flanges or standoffs 78), and ribs 80-A, 80-B (collectively, ribs 80). In one arrangement, the diameter of the pin 48 is substantially 0.080 mils, and the length of the pin 48 is substantially 0.562 mils.

As shown in FIG. 3, the portions 70, 72 of the power pin 48 extend along an axis 82. When the power pin is installed within the pin assembly 26 (also see FIG. 2), the axis 82 is substantially perpendicular to the X-Y plane. In particular, the inner flanges 76 of the power pin 48 rigidly lock the mid-portion 70 of the power pin 48 to the frame 38 and maintain the power pin 48 in its perpendicular orientation to the frame 38.

In one arrangement, after the power pin 48 is installed within the frame 38 (see FIG. 2), a solder pre-form 84 installs over an end 72 of the power pin 48. In particular and as shown in FIG. 3, the solder pre-form 84 rests against an outer flange 78-A. The ribs 80-A (behind the solder pre-form 84 and illustrated by the arrow 80-A in FIG. 3) hold the solder pre-form 84 in place and prevent the solder pre-form 84 from slipping off of the end 72-A.

It should be understood that, during soldering, the solder pre-form 84 is configured to melt and flow into a plated-through hole of a circuit board (see the holes 54, 56 in the circuit boards 22, 24 of FIG. 1). The grooves 84 defined by the pin end 72-A facilitates healthy solder flow into the plated-through hole and around the pin end 72-A, as well as enables gas within the plated-through hole to escape (e.g., percolate) from the plated-through hole. Eventually, the pin end 72-A is naturally drawn further into the plated-through hole by the affinity of the solder for wetted metal surfaces as well as the surface tension of the solder. As a result, the circuit board tends to sit approximately flush uniformly against the flange 78-A at the end of the soldering process. A power pin which is similar to that mentioned above, and which further requires inner flanges, is described in U.S. patent application Ser. No. 09/658,764, entitled "Techniques for Forming a Connection Between a Pin and a Circuit Board", and filed Sep. 8, 2000, the teachings of which are hereby incorporated by reference in their entirety. Further details of the invention will now be described with reference to FIG. 4.

FIG. 4 is a side view of a signal pin 46 of the pin assembly 26. Each signal pin 46 includes a mid-portion 90, and end portions 92-A, 92-B (collectively, end portions or simply ends 92). Each signal pin 46 further includes inner flanges 94-A, 94-B (collectively, inner flanges 94), outer flanges 96-A, 96-B (collectively, outer flanges 96), and ribs 98-A, 98-B (collectively, ribs 98). In one arrangement, the diameter of the pin 46 is substantially 0.0245 mils and the length of the pin 46 is substantially 0.562 mils.

As shown in FIG. 4, the portions 90, 92 of the signal pin 46 extend along an axis 100. When the signal pin 46 is installed within the pin assembly 26 (also see FIG. 2), the axis 100 is substantially perpendicular to the X-Y plane. In particular, the inner flanges 94 of the signal pin 46 rigidly lock the mid-portion 90 of the signal pin 46 to the frame 38 and thus maintain the signal pin 46 in its perpendicular orientation to the frame 38.

In one arrangement, after the signal pin 46 is installed within the frame 38 (see FIG. 2), a solder pre-form 102 installs over an end 92 of the signal pin 46. In particular and as shown in FIG. 4, the solder pre-form 102 rests against an outer flange 96-A. The ribs 98-A (behind the solder pre-form 102 and illustrated by the arrow 98-A in FIG. 4) hold the solder pre-form 102 in place and prevent the solder pre-form 102 from sliding off of the end 92-A.

It should be understood that, during soldering, the solder pre-form 102 is configured to melt and flow into a plated-through hole of a circuit board. To this end, the pin end 92-A is naturally drawn further into the plated-through hole by the affinity of the solder for metal surfaces as well as the surface tension of the solder. As a result, the circuit board tends to sit approximately flush against the flange 96-A for formation of a healthy and robust solder joint. Further details of the invention will now be provided with reference to FIGS. 5 and 6.

Figure 5:
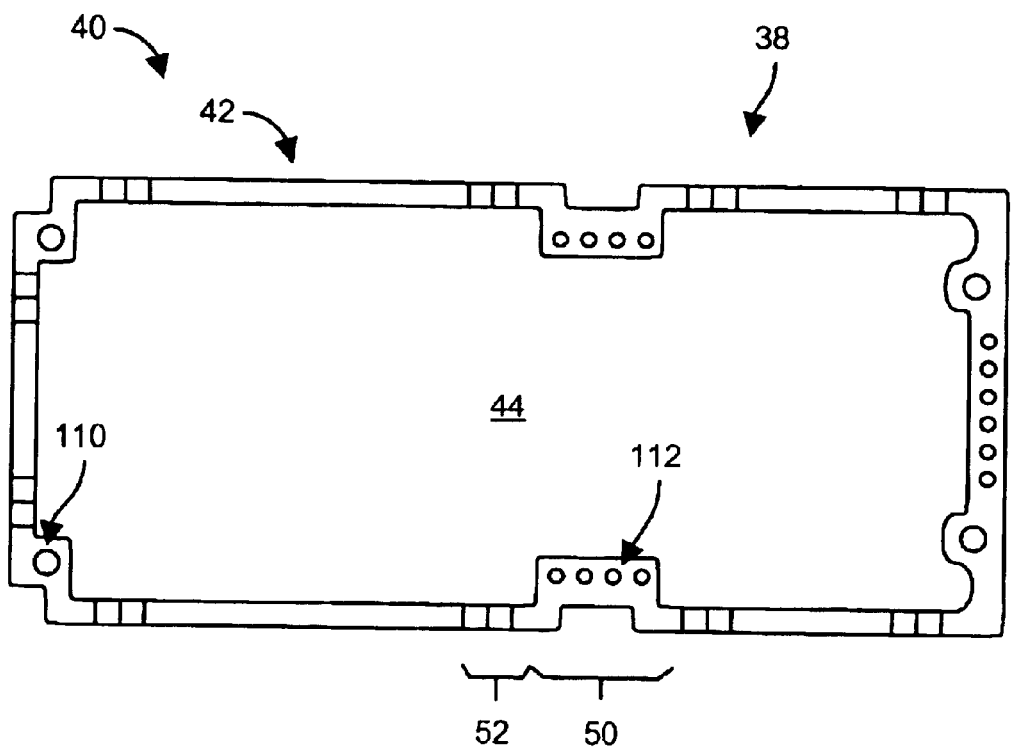
FIG. 5 is a detailed bottom view of a frame of the pin assembly of FIG. 2.
Figure 6:
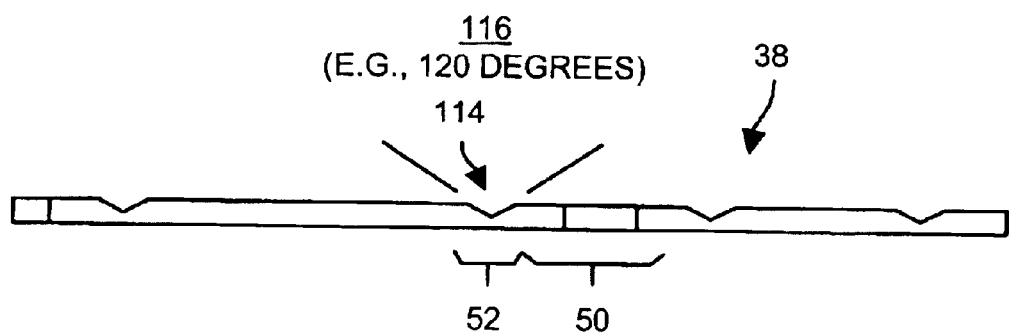
FIG. 6 is a detailed side view of the frame of FIG. 5.

FIGS. 5 and 6 respectively show a detailed bottom view and a detailed side view of the frame 38. It should be clear from a comparison of FIG. 5 with FIGS. 1 and 2 that FIGS. 1 and 2 illustrate the frame 38 of the pin assembly 26 as having a general rectangular shape 40, but that the frame 38 has particular details which deviate from making the frame 38 a perfect rectangle. As shown in FIG. 5, the material of the frame 38 extends around the periphery 42 of the rectangle 40, but avoids the inner region 44 of the rectangle in order to prevent contact with any of the circuit board components 30, 34 (also see FIG. 1) and to enable heat to escape.

As shown in FIG. 5, the frame 38 defines holes 110 through which the power pins 48 extend. Similarly, the frame further defines holes 112 through which the signal pins 46 extend. The diameter of the power pin holes 110 is larger than the diameter of the signal pin holes 112 since the power pins 48 are thicker than the signal pins 46. It should be clear from the bottom view of the frame 38 that the holes 110, 112 reside only in the thick portions 50 of the frame 38, and do not reside in any of the stress-relief portions 52 of the frame 38. The stress-relief portions 52 operate as buffers or living hinges to prevent substantial bowing or warping of the pin assembly 26 which could lead to pin binding when mounting the pin assembly 20 to a circuit board.

As shown in FIG. 6, the stress-relief portions 52 of the frame 38 defines V-shaped notches 114 in the frame material (e.g., plastic, ceramic material, metal, a high temperature polymer, combinations thereof, etc.). In one arrangement, each notch 114 extends a predetermined distance into the material (e.g., halfway, two-thirds of the way, etc.). In one arrangement, the notch defines a wide angle (e.g., 120 degrees or 60 degrees from vertical in each direction). In one arrangement, the length of each notch 114 is substantially 0.076 inches within a predetermined margin of error (e.g., +/−10%). In another arrangement, the stress-relief portions 52 define a uniformly thin bridge (i.e., a bridge having a uniform rectangular-shaped cross-section) rather than a notch. Other formations are suitable for use as well in the stress-relief portions 52. A discussion of how a manufacturer makes the pin assembly 26 which uses the pins 36 (see the power pin 48 of FIG. 3 and the signal pin 46 of FIG. 4) and the frame 38 will now be provided with reference to FIG. 7.

Figure 7:
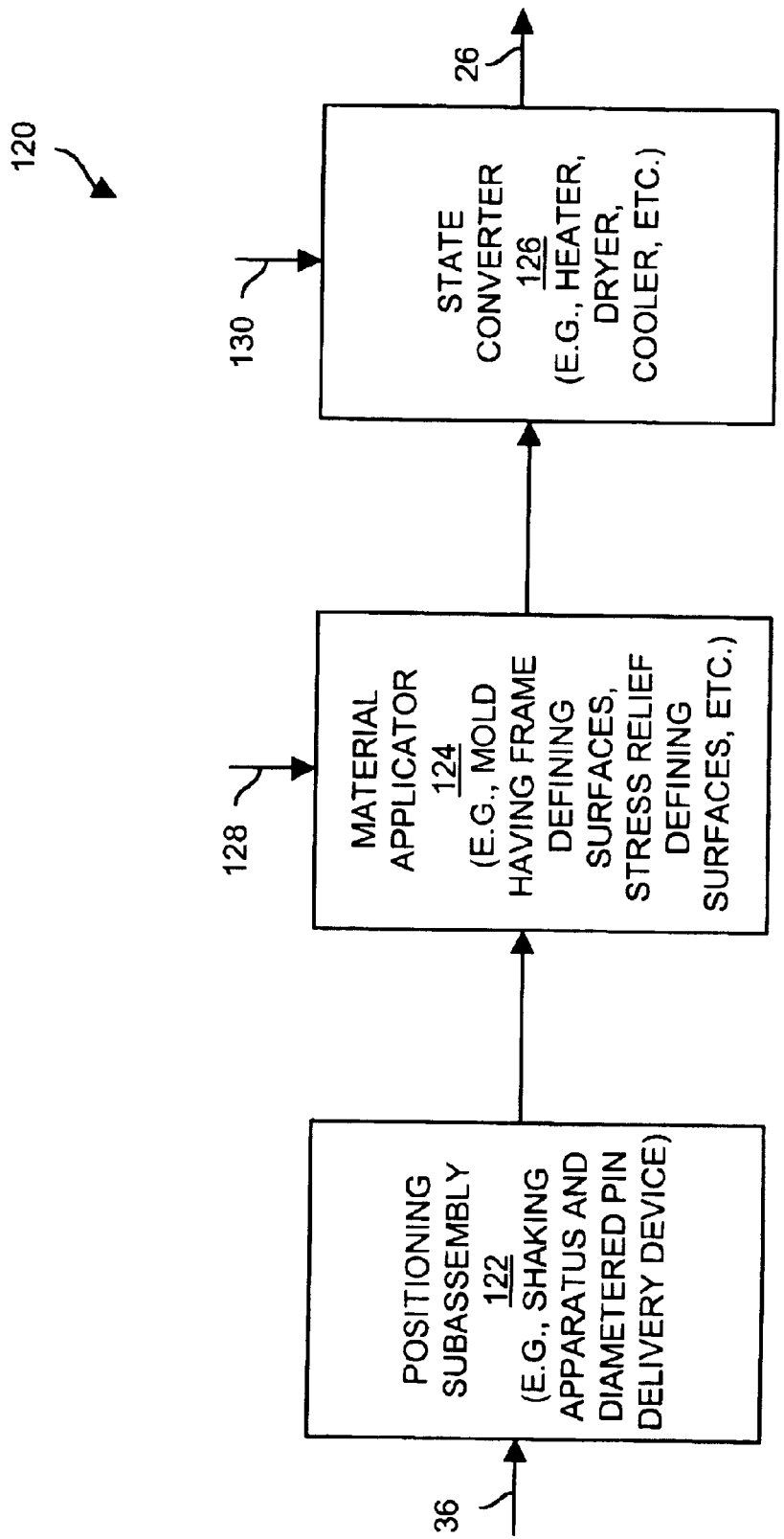
FIG. 7 is a block diagram of a system for making the pin assembly of FIG. 2.

FIG. 7 shows a pin assembly manufacturing system 120 for making the pin assembly 26. As shown, the system 120 includes a positioning subassembly 122, a material applicator 124 and a state converter 126. Although the components 122, 124, 126 are illustrated in a staged or pipelined configuration, the components 122, 124, 126 are well suited for integration at a single location on a manufacturing floor.

During operation of the system 120, the positioning subassembly 122 receives the pins 36 (i.e., the signal pins 46 and the power pins 48) and positions them properly relative to each other. In one arrangement, the positioning subassembly 122 includes a shaking apparatus (e.g., a shaker table). A user, or alternatively automated equipment, lays the pins 36 on the shaking apparatus. The shaking apparatus then vibrates and the pins 36 fall into their proper locations within a delivery device having specialized diametered holes that trap and align the pins 36.

Then, the material applicator 124 receives material 128 that will eventually become the frame 38 and applies the material 128 to the pins 36. In particular, the material applicator 124 moves the material 128 around the pins 36 such that the material 128 flows into place to form the thick segments 50 and the stress-relief segments 52. In one arrangement, the pins 36 reside in a mold or cast, and the material applicator 124 includes injection mold equipment which fills the mold with the material 128 in a liquid state (e.g., molten plastic, ceramic material in liquid form, etc.). In this arrangement, the material 128 flows into a cavity defined by the mold. In particular, surfaces defined by the mold move the material 128 to form the thick segments 50 and the stress-relief segments 52. That is, the mold surfaces delineate the shape and contour of the frame 38. Throughout the remainder of the system 120, the pins 46, 48 are maintained in their proper positions (e.g., substantially parallel and even with each other) in order to later facilitate uniform insertion height for the pins 46, 48 when the pin assembly 26 mounts onto the circuit boards 22, 24.

Next, the state converter 126 changes the state of the material 128 from the liquid state to the solid state. The resulting pin assembly 26 includes the pins 36 and a rigid frame 38 formed from the material 128 which is now in the solid state. The pins 36 are disposed in predetermined positions on the frame 38 and extend in directions which are substantially perpendicular to the plane defined by the frame 38 (also see FIG. 2). In one arrangement, the state converter 126 includes a device which provides treatment 130 (e.g., heat from heating elements, temperature reduction from cooling elements, dry gas from a dryer, combinations thereof, etc.) which forces or accelerates the state change of the material 130 from the liquid state to the solid state.

Figure 8:
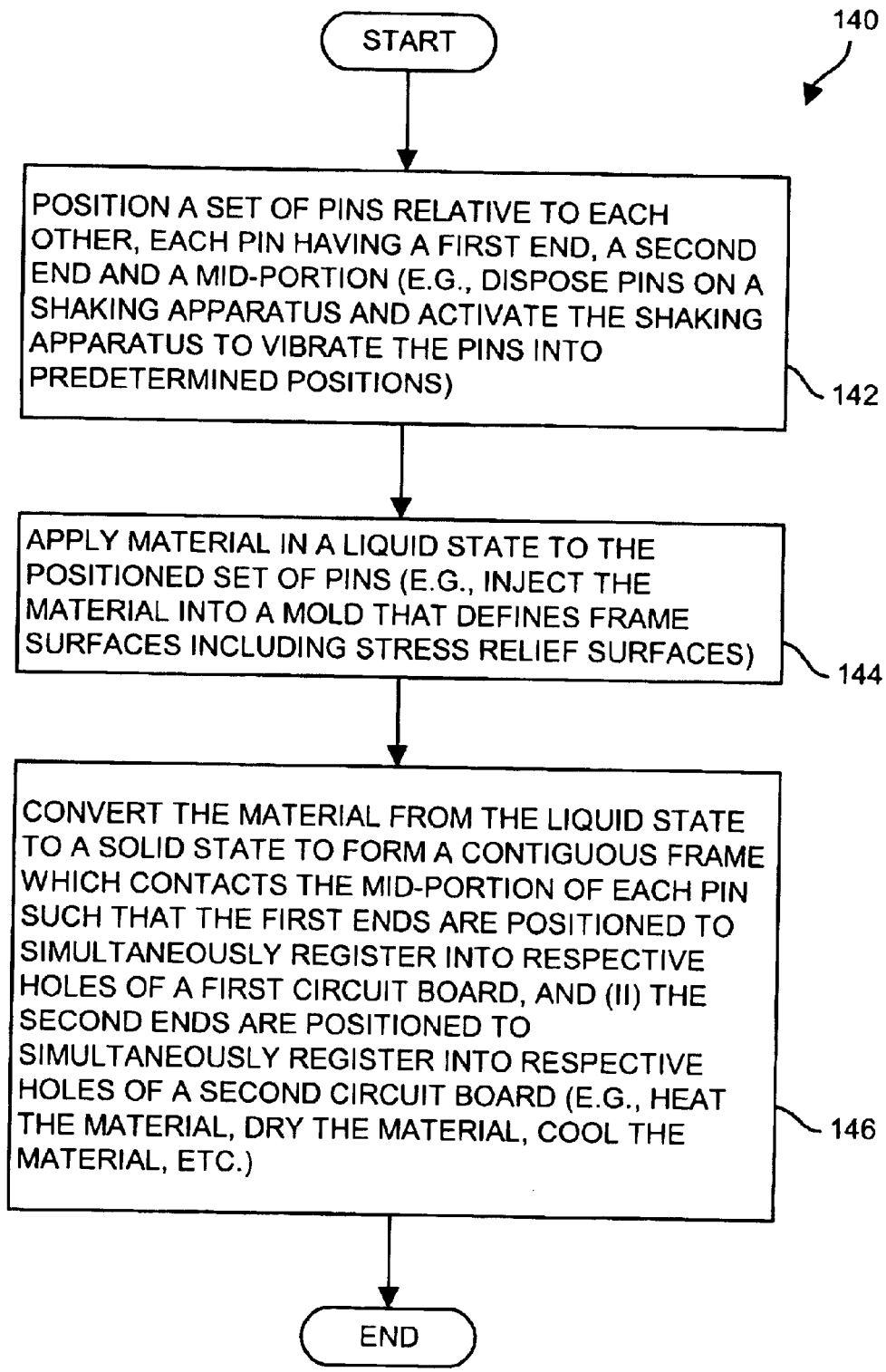
FIG. 8 is a flowchart of a procedure for making the pin assembly of FIG. 2.

FIG. 8 is a flowchart of a procedure 140 which is performed by the pin assembly manufacturing system 120. In step 142, the positioning assembly 122 positions a set of pins 36 relative to each other (see the signal pins 46 and the power pins 48 of FIG. 1). Each pin 46, 48 includes a first end 72-A, 92-B, a second end 72-B, 92-B, and a mid-portion 70, 90). In one arrangement, a shaking apparatus of the positioning assembly 122 vibrates to move the pins 36 into proper alignment in a device which locates and aligns each pin 36 (i.e., a diametered pin delivery device).

In step 144, the material applicator 124 applies the material 128 in a liquid state (e.g., molten plastic from a furnace or an extruder) to the set of pins 36. In one arrangement, the material applicator 124 includes (i) a mold having surfaces that define the shape of the frame 38, and (ii) equipment which injects the material 128 into the mold for healthy and robust contact with the set of pins 36. Such operation avoids forming unintended recesses and weak-points in the frame 38 which could otherwise result in the pins 36 mis-aligning with the frame 38, or which could result in poor or incorrect pin registration when the pin assembly 20 engages with a circuit board.

In step 146, the state converter 126 changes the state of the material 128 from the liquid state to the solid state. As the material 128 hardens, the pins 36 become rigidly held in place in their proper predetermined positions for proper pin registration when the pin assembly 26 is later mounted to the circuit boards. In particular, after the material 128 solidifies, the pins 36 extend in directions which are substantially perpendicular to the plane defined by the frame 38. The flanges 76, 94 of the pins 46, 48 support the pins 46, 48 within the frame 38 and enable the pins 46, 48 to securely grip the frame 38 with little or no movement (also see FIGS. 3 and 4).

In one arrangement, the state converter 126 includes a set of cooling elements which cools the material 128 (e.g., molten polymer) to change the material to the solid state. In another arrangement, the state converter 126 includes a set of heating elements which applies heat to the material 128 to change the material to the solid state (e.g., bakes the material 128). In yet another arrangement, the state converter 126 includes a dryer which extracts moisture from the material 128 to change the material to the solid state (e.g., a dry gas source). Further details of the invention will now be provided with reference to FIG. 9.

Figure 9:
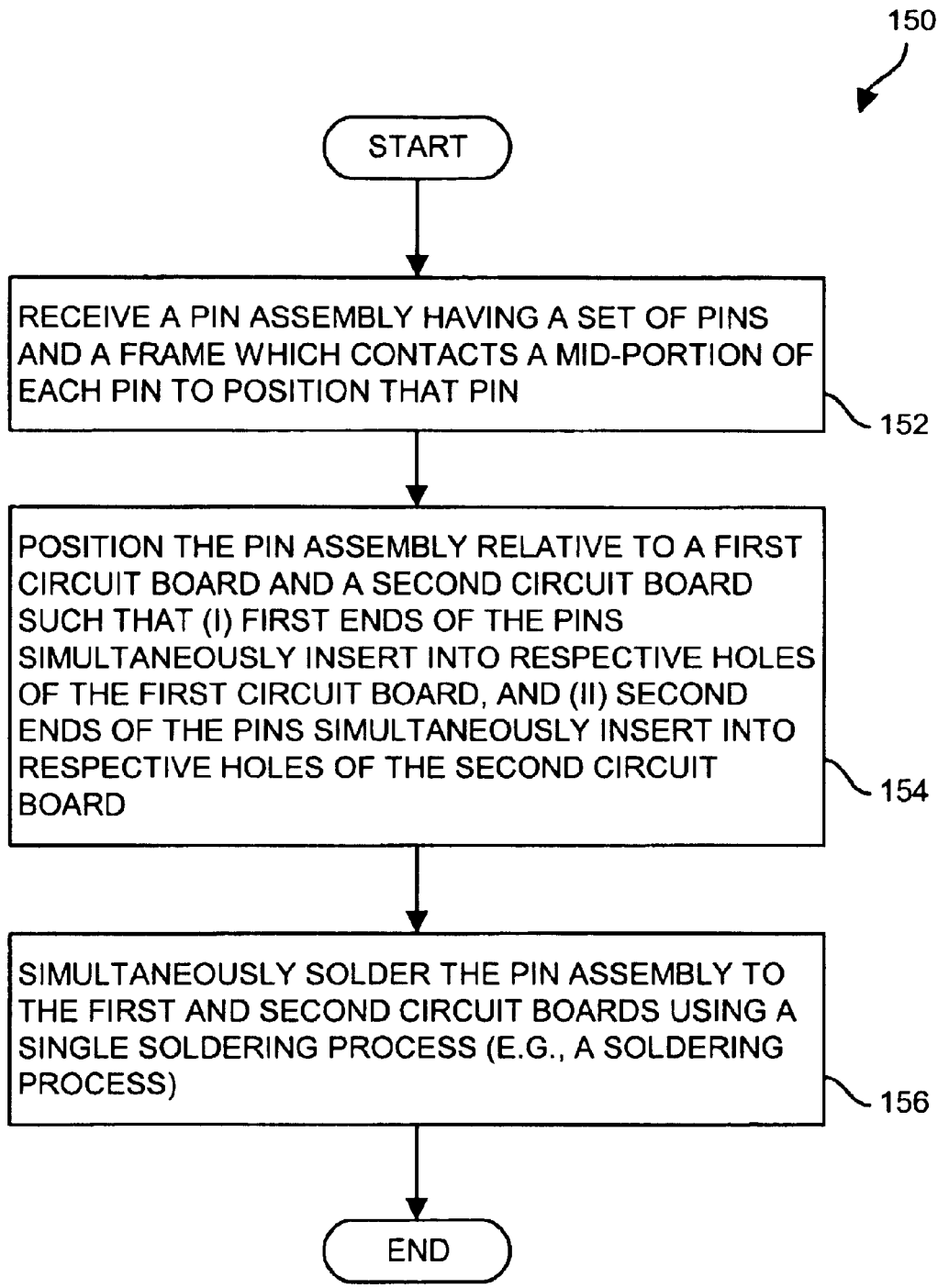
FIG. 9 is a flowchart of a procedure for making the circuit board assembly of FIG. 1.

FIG. 9 is a flowchart of a procedure 150 which is performed by a manufacturer of the circuit board assembly 20 (also see FIG. 1). In step 152, the manufacturer receives the pin assembly 26 having the set of pins 36 (i.e., the signal pins 46 and the power pins 48) and the frame 38 (FIG. 2). Recall that the frame 38 attaches to a mid-portion 70, 90 of each pin 46, 48. In one arrangement, the pins 46, 48 include solder pre-forms 84, 102 at one end 72-A, 92-A.

In step 154, the manufacturer positions the pin assembly 26 relative to the circuit board 22 and the circuit board 24 such that the pin ends 72-B, 92-B simultaneously insert into respective holes 54 of the circuit board 22, and the pin ends 72-A, 92-A simultaneously insert into respective holes 56 of the circuit board 24 (also see FIG. 1). In one arrangement, the manufacturer lays the circuit board 22 horizontally and prints solder paste (e.g., a mixture of solder and flux) over the respective holes 54 of the circuit board 22. The manufacturer then places the pin assembly 26 onto the circuit board 22 such that the pin ends 72-B, 92-B engage the holes 54. Next, the manufacturer lays the circuit board 24 on top of the pin assembly 26 such that the pin ends 72-A, 92-A engage respective holes 56 of the circuit board 24. An unsoldered circuit board assembly 20 is now formed by the circuit boards 22, 24 and the pin assembly 26.

In step 156, the manufacturer simultaneously solders the pin assembly 26 to the circuit boards 22, 24 using a single soldering process. In particular, the manufacturer passes the unsoldered circuit board assembly 20 through a soldering apparatus (e.g., a soldering machine) to solder the pin assembly 26 to the circuit boards 22, 24. In one arrangement, the soldering process is an intrusive reflow process in which the holes 54, 56 have relatively tight clearances around the pin ends 72, 92 thus enabling the use of relatively small anti-pads and providing less restrictions on neighboring traces. In one arrangement, the circuit boards 22, 24 have previously soldered components 30, 34 mounted thereon which do not reflow due to installation using a higher temperature solder. As the solder at the pins 46, 48 of the pin assembly 26 wets to the metal of the holes plated-through holes 54, 56, gravity and the drawing forces of the solder tend to position the circuit boards 22, 24 flush against the flanges 78, 96 of the pins 46, 48. In particular, the thicker power pins 48 which include grooved ends 72 to facilitate solder flow into the holes 54, 56 and gas percolation out of the holes 54, 56 tends to guide the signal pins 46 of the pin assembly 26 into their proper holes 54, 56 within the circuit boards 22, 24 (i.e., the power pins 48 operate as datums to properly align the pin assembly 26 relative to the circuit boards 22, 24). The proper positioning of the pins 46, 48 within the frame 38 in combination with the flanges 78, 96 abutting the circuit boards 22, 24 guarantees uniform insertion height for the pins 46, 48 within the circuit board holes 54, 56. In one arrangement, the holes 54, 56 are toleranced to provide substantially 0.006 mils of diametrical clearance around each pin 46, 48 (i.e., 0.003 mils of radial true position). The result is a circuit board assembly 20 have a set of robust and reliable solder joints due to proper registration of the pin ends 72, 92 within the holes 54, 56 of the circuit board 22, 24 prior to soldering.

It should be understood that the frame 38 of the pin assembly 26 holds the set of pins 46, 48 rigidly in place during step 154 so that the ends 72, 92 reliably enter the respective holes 54, 56 for formation of robust and reliable solder joints (e.g., with solder at least 270 degrees around each pin end 72, 92, in accordance with an IPC standard, etc.). Moreover, the amount of time required for step 154 is significantly less than the amount of time required to perform a conventional procedure of the ends of pins one at a time into the holes of one circuit board, and then subsequently placing the other ends of the pins into the holes of another circuit board.

Furthermore, it should be understood that there is less likelihood of error in step 154. In particular, there is little or no risk to inadvertently moving a pin end out of proper registration when using the pin assembly 26 since the frame 38 continuously maintains the pins 46, 48 in their proper positions and orientations. Thus, it is unlikely that a pin 46, 48 could be inadvertently moved out of place, as in the conventional approach when an previously placed pin is disturbed while installing another pin. Accordingly, deficiencies of the conventional approach such as the need for a large amount of time to install the pins and the associated expenses of reworking circuit board assemblies with improperly mounted pins is greatly avoided by the invention.

Additionally, it should be understood that any deformation of the circuit boards 22, 24 or the material of the frame 38 during the soldering process (e.g., expansion or warping due to different coefficients of expansion during heating) is accommodated by the stress-relief portions 52 of the frame 38. In particular, the stress-relief portions 52 flex (e.g., bend, twist, shrink, stretch, etc.) to maintain the pins 46, 48 in their proper positions and orientations within the circuit boards 22, 24 during soldering. Accordingly, there is no bending of the pins 46, 48 (e.g., binding of the signal pins 46) during soldering. Further details of the invention will now be provided with reference to FIG. 10.

Figure 10:
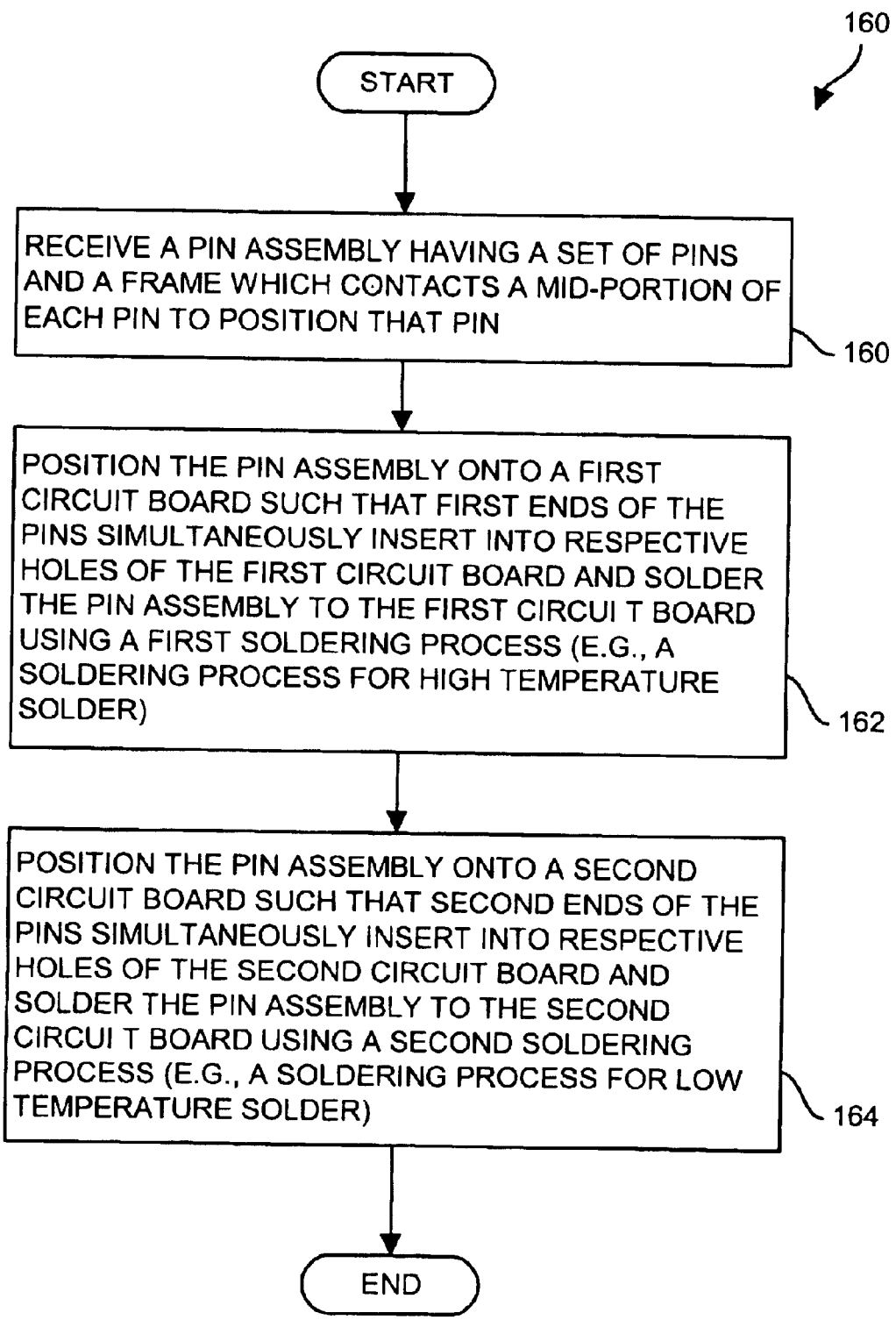
FIG. 10 is a flowchart of an alternative procedure for making the circuit board assembly of FIG. 1.

FIG. 10 is a flowchart of an alternative procedure 160 which is performed by a manufacturer of the circuit board assembly 20 (FIG. 1). In step 162, the manufacturer receives the pin assembly 26 having the set of pins 36 and the frame 38 (FIG. 2). At this point, the frame 38 of the pin assembly 26 contacts a mid-portion 70, 90 of each pin 46, 48 to firmly hold the pins 46, 48 in proper position.

In step 164, the manufacturer (i) positions the pin assembly 26 relative to the circuit board 24 such that the ends 72-A, 92-A of the pins 46, 48 simultaneously insert into respective holes 56 of the circuit board 24, and then (ii) solders the pin assembly 26 to the circuit board 24. In one arrangement, the manufacturer positions the circuit board 24 horizontally (i.e., upside-down from the orientation shown in FIG. 1). The manufacturer then places the pin assembly 26 over the circuit board 24 so that the pin ends 72-A, 92-A simultaneously engage the holes 56 (i.e., also upside-down from the orientation shown in FIG. 1). Next, the manufacturer solders the pin assembly 26 to the circuit board 24. The end result is a module having a circuit board 24 and a pin assembly 26 robustly mounted to the circuit board 24 by a healthy and reliable set of solder joints. In one arrangement, prior to soldering, the pins 46, 48 included solder pre-forms 84, 102 at the ends 72-A, 92-A. In another arrangement, the manufacturer prints solder paste over the holes 56 prior to placing the pin assembly 26 onto the circuit board 24 (e.g., an intrusive reflow soldering process). In yet another arrangement, the manufacturer uses the solder pre-forms 84, 102 as well as prints additional solder paste.

In step 166, the manufacturer (i) positions the pin assembly 26 of the formed module relative to the other circuit board 22 such that the pin ends 72-B, 92-B of the pins 46, 48 simultaneously insert into respective holes 54 of the circuit board 22, and then (ii) solders the pin assembly 26 to the circuit board 24. In one arrangement, the manufacture lays the circuit board 22 horizontally (see FIG. 1). The manufacturer then places the pin assembly 26 over the circuit board 22 so that the pin ends 72-B, 92-B simultaneously engage the holes 54 of the circuit board 22. Next, the manufacturer solders the pin assembly 26 to the circuit board 22. Again, in one arrangement, the pins 46, 48 include solder pre-forms 84, 102 at the ends 72-B, 92-B. In another arrangement, the manufacturer prints solder paste over the holes 56 prior to placing the pin assembly 26 onto the circuit board 24. In yet another arrangement, the manufacturer uses the solder pre-forms 84, 102 as well as prints additional solder paste. At the end of step 166, the manufacturer has created the circuit board assembly 20 (FIG. 1) in which the circuit boards 22, 24 are robustly connected through the pin assembly 26.

The invention is directed to techniques for making a circuit board assembly 20 which utilize a pin assembly 26 having a set of pins 36 and a frame 38 which holds the set of pins 36 in place. The pin assembly 26 enables a manufacturer to simultaneously engage ends 72, 92 of the pins 36 into a first circuit board 22 and then simultaneously register opposite ends 72, 92 of the pins 36 into a second circuit board 24. During assembly and during soldering, the frame 38 holds the pins 36 in place to ensure proper and consistent pin registration in each circuit board 22, 24.

While this invention has been particularly shown and described with references to preferred embodiments thereof, it will be understood by those skilled in the art that various changes in form and details may be made therein without departing from the spirit and scope of the invention as defined by the appended claims.

For example, it should be understood that the frame 38 was described above as entirely surrounding each pin 46, 48 around its mid-portion 70, 90 to hold the pins 46, 48 properly in place by way of example only. In other arrangements, the frame 38 does not entirely surround the mid-portions 70, 90 of the pins 46, 48. In one arrangement, the frame 38 defines C-shaped regions which encircle most of the mid-portions 70, 90 but that do not entirely surround the mid-portions 70, 90 (e.g., the C-shaped regions encircle at least 50% of the mid-portions).

Additionally, it should be understood that the above-described soldering processes in the procedures 150, 160 were explained as soldering the pin assembly 26 to the circuit boards 22, 24 without mention of soldering other components using the same process. In some arrangements, other circuit board components 30, 32 (e.g., IC devices, resistors, capacitors, connectors, etc.) are soldered concurrently while soldering the pin assembly 26 (e.g., intrusive reflow soldering, wave soldering, etc.).

Furthermore, it should be understood that certain steps can be combined, expanded or modified. For example, step 164, which describes a pin assembly 26 being positioned and soldered to a circuit board 24, may involve soldering multiple pin assemblies 26 to multiple circuit boards 24 at the same time. In one arrangement, during step 164, the manufacturer places multiple pin assemblies 26 on an aggregate board which includes multiple circuit boards 24 (e.g., a ×4 array of circuit boards 24). That is, the manufacturer places the pin assemblies 26 over respective circuit boards 24 which are connected together (e.g., by tabs). The manufacturer then solders the pin assemblies 26 to the circuit boards 24 by sending the aggregate board through a soldering process (e.g., a wave soldering machine, an intrusive reflow soldering process, etc.). The manufacturer then cuts the aggregate board into individual circuit boards 24 for use in step 166.

Additionally, it should be understood that the manufacturer can cut away portions of the pin assembly frame 38 after the pin assembly 26 is mounted to one or both circuit boards 22, 24. Removal of portions of the frame 38 exposes circuitry between the two circuit boards 22, 24 for improved air circulation (e.g., to remove heat during operation) or to enable attachment of other devices nearby (e.g., a heat sink).

Furthermore, it should be understood that the configuration for the signal pin 46 with outer flanges 96 and ribs 98 (see FIG. 4) was provided by way of example only. In other arrangements, the signal pin 46 does not include the outer flanges 96, the ribs 98 and/or both. In such other arrangements, the uniform insertion depth of the pin ends 92 is determined by the power pins 48 which do have outer flanges 78 (see FIG. 3). Without the outer flanges 96 and the ribs 98 on the signal pin 46, there are no obstructions around the circuit board holes 54, 56. Accordingly, gas within the holes more easily percolates from the holes 54, 56 during soldering thus enabling improved solder wicking and formation of more robust solder joints. Additionally, such signal pins 46 without outer standoffs are less expensive to manufacture.

Figure 11:
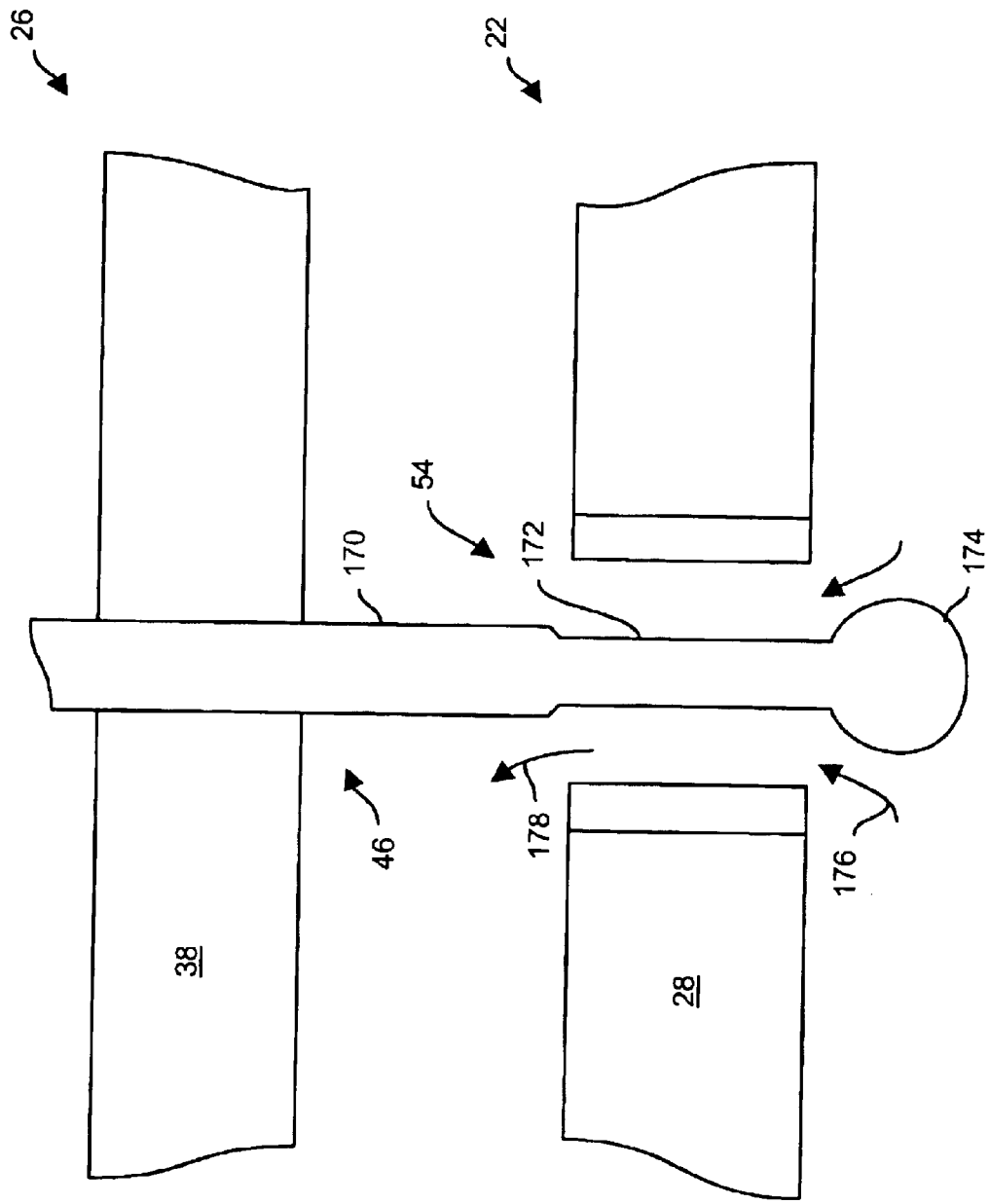
FIG. 11 is a cross-sectional view of a circuit board and the pin assembly of FIG. 2 when the pin assembly utilizes a signal pin having a configuration which is an alternative to that shown in FIG. 4.

FIG. 11 shows an alternative signal pin configuration for the signal pin 46. By way of example only, the signal pin 46 is already fastened to the frame 38 of the pin assembly 26 and ready for wave soldering to the circuit board section 28 of the circuit board 22. As shown in FIG. 11, the signal pin 46 (which can still include the inner flanges 94 although not shown in FIG. 11 for simplicity) has a relatively thick shaft portion 170 and a thinner stem 172 leading to a wider end portion 174. The thick shaft portion 170 provides strength as well as a thorough electrical pathway to the circuit board 22. The thinner stem in 172 enables the circuit board section 28 to have a smaller diameter plated-through hole 54. Accordingly, the anti-pad for the hole 54 is smaller and less restrictive on neighboring traces for easier trace routing and improved signal integrity. The wider end portion 174 is, by way of example only, ball-shaped and provides more surface to facilitate solder wicking into the hole 54. As a result, solder more easily travels in the direction 176 into the hole 54 as gas escapes from the hole in the direction 178 for formation of a reliable and healthy solder joint. Such modifications and enhancements are intended to be part of various embodiments of the invention.

What is claimed is:

1. A pin assembly for interconnecting a first circuit board and a second circuit board, the pin assembly comprising:
   a set of pins, each pin of the set of pins having a first end, a second end, and a mid-portion; and
   a frame which contacts the mid-portion of each pin of the set of pins to position the pins such that (i) the first ends of the pins simultaneously register into respective holes of the first circuit board when the pin assembly engages with the first circuit board, and (ii) the second ends of the pins simultaneously register into respective holes of the second circuit board when the pin assembly engages with the second circuit board;
   wherein multiple pins of the set of pins include outer soldering flanges configured to form portions of solder joints with corresponding circuit board contacts.

2. The pin assembly of claim 1 wherein each pin of the multiple pins of the set of pins further includes:
   inner flanges which define the mid-portion of the pin and which are configured to hold the pin rigidly in place relative to the frame.

3. The pin assembly of claim 2 wherein the frame defines an X-Y plane, and wherein each pin extends along an axis which is substantially perpendicular to the X-Y plane.

4. The pin assembly of claim 1 wherein the frame includes a set of stress-relief portions which is configured to flex in response to uneven stresses placed on the pin assembly.

5. The pin assembly of claim 4 wherein the set of stress-relief portions includes frame segments which define V-shaped notches.

6. The pin assembly of claim 1 wherein the set of pins includes:
   a set of power pins; and
   a set of signal pins, wherein each power pin of the set of power pins has a power pin diameter, and wherein each signal pin of the set of signal pins has a signal pin diameter that is narrower than the power pin diameter.

7. The pin assembly of claim 6 wherein set of signal pins includes:
   a first cluster of signal pins disposed in a first row through a first segment of the frame; and
   a second cluster of signal pins disposed in a second row through a second segment of the frame.

8. The pin assembly of claim 1 wherein the frame defines a rectangular shape, and wherein the frame substantially extends around a periphery of the defined rectangular shape while substantially avoiding an inner region of the defined rectangular shape.

9. The pin assembly of claim 1 wherein the frame contacts each pin of the set of pins substantially along a center of the pin.

10. The pin assembly of claim 9 wherein the frame extends within an X-Y plane, and wherein the frame is configured to rigidly lock the each pin of the set of pins in a substantially perpendicular orientation to the X-Y plane.

11. The pin assembly of claim 1 wherein the frame defines (i) pin-holding segments which respectively hold separate groups of pins, and (ii) bridge segments which provide stress-relief between the pin-holding segments which respectively hold the separate groups of pins.

12. The pin assembly of claim 11 wherein each pin-holding segment has a first cross-section, wherein each bridge segment has a second cross-section, and wherein the first cross-section is larger than the second cross-section.

13. The pin assembly of claim 11 wherein the pin-holding segments and the bridge segments are interconnected with each other in an alternating manner to form a series of V-shaped notches distributed along the frame.

14. The pin assembly of claim 1 wherein the frame substantially defines a rectangle and an aperture at a center of the rectangle to enable placement of components therein and heat to escape when the pin assembly is disposed between the first and second circuit boards.

15. The pin assembly of claim 14 wherein the set of pins includes:
   signal pins disposed substantially along sides of the rectangle defined by the frame; and
   power pins disposed substantially in corners of the rectangle defined by the frame.

16. The pin assembly of claim 1 wherein the circuit board contacts are vias, and wherein the outer soldering flanges define grooves to facilitate gas percolation from the vias during soldering.

17. The pin assembly of claim 1 wherein the frame includes a molded member which is cast around the set of pins to provide a rigid locking fit.

18. The pin assembly of claim 1 wherein the set of pins includes:
   a pin having ball-shaped end and a shaft, the ball-shaped end having a diameter that is larger than that of the shaft to facilitate solder wicking from the ball-shaped end along at least a portion of the shaft during a soldering process.

19. A pin assembly for interconnecting a first circuit board and a second circuit board, the pin assembly comprising:
   a set of pins, each pin of the set of pins having a first end, a second end, and a mid-portion;
   a frame which contacts the mid-portion of each pin of the set of pins to position the pins such that (i) the first ends of the pins simultaneously register into respective holes of the first circuit board when the pin assembly engages with the first circuit board, and (ii) the second ends of the pins simultaneously register into respective holes of the second circuit board when the pin assembly engages with the second circuit board; and
   a set of solder pre-forms which is attached to the set of pins to facilitate soldering the set of pins;
   wherein the frame contacts each pin of the set of pins substantially along a center of the pin; wherein the frame extends within an X-Y plane; and wherein the frame is configured to rigidly lock the each pin of the set of pins in a substantially perpendicular orientation to the X-Y plane.

20. A pin assembly for interconnecting a first circuit board and a second circuit board, the pin assembly comprising:
   a set of pins, each pin of the set of pins having a first end, a second end, and a mid-portion; and
   a frame coupled to a center of the mid-portion of each pin of the set of pins to position (i) the first ends of the pins for simultaneous registration into respective holes of the first circuit board when the pin assembly engages with the first circuit board, and (ii) the second ends of the pins for simultaneous registration into respective holes of the second circuit board when the pin assembly engages with the second circuit board;
   wherein multiple pins of the set of pins include outer soldering flanges configured to form portions of solder joints with corresponding circuit board contacts.

21. The pin assembly of claim 20, wherein the frame contacts each pin of the set of pins substantially along a center of the pin.

22. The pin assembly of claim 21, wherein the frame extends within an X-Y plane, and wherein the frame is configured to rigidly lock the each pin of the set of pins in a substantially perpendicular orientation to the X-Y plane.

23. The pin assembly of claim 20 wherein the frame defines (i) pin-holding segments which respectively hold separate groups of pins, and (ii) bridge segments which provide stress-relief between the pin-holding segments which respectively hold the separate groups of pins.

24. The pin assembly of claim 23 wherein each pin-holding segment has a first cross-section, wherein each bridge segment has a second cross-section, and wherein the first cross-section is larger than the second cross-section.

25. The pin assembly of claim 23 wherein the pin-holding segments and the bridge segments are interconnected with each other in an alternating manner to form a series of V-shaped notches distributed along the frame.

26. The pin assembly of claim 20 wherein the frame substantially defines a rectangle and an aperture at a center of the rectangle to enable placement of components therein and heat to escape when the pin assembly is disposed between the first and second circuit boards.

27. The pin assembly of claim 26 wherein the set of pins includes:

signal pins disposed substantially along sides of the rectangle defined by the frame; and power pins disposed substantially in corners of the rectangle defined by the frame.

28. The pin assembly of claim 20 wherein the circuit board contacts are vias, and wherein the outer soldering flanges define grooves to facilitate gas percolation from the vias during soldering.

29. The pin assembly of claim 20 wherein the frame includes a molded member which is cast around the set of pins to provide a rigid locking fit.

30. The pin assembly of claim 20 wherein the set of pins includes:

a pin having ball-shaped end and a shaft, the ball-shaped end having a diameter that is larger than that of the shaft to facilitate solder wicking from the ball-shaped end along at least a portion of the shaft during a soldering process.

31. A pin assembly for interconnecting a first circuit board and a second circuit board, the pin assembly comprising:

a set of pins, each pin of the set of pins having a first end, a second end, and a mid-portion;

a frame coupled to a center of the mid-portion of each pin of the set of pins to position (i) the first ends of the pins for simultaneous registration into respective holes of the first circuit board when the pin assembly engages with the first circuit board, and (ii) the second ends of the pins for simultaneous registration into respective holes of the second circuit board when the pin assembly engages with the second circuit board; and a set of solder pre-forms which is attached to the set of pins to facilitate soldering the set of pins wherein the frame contacts each pin of the set of pins substantially along a center of the pin; wherein the frame extends within an X-Y plane; and wherein the frame is configured to rigidly lock the each pin of the set of pins in a substantially perpendicular orientation to the X-Y plane.

* * * * *